(12) United States Patent
Lin et al.

(10) Patent No.: US 6,306,557 B1
(45) Date of Patent: Oct. 23, 2001

(54) PROCESS FOR PREPARING WATER DISPERSIBLE NEGATIVE-TYPE PHOTOSENSITIVE COMPOSITIONS

(75) Inventors: Hsien Kuang Lin, Taipei; Jauder Jeng, Taichung Hsien, both of (TW)

(73) Assignee: Industrial Technology Research Foundation, Hsinchu (TW)

( * ) Notice: Subject to any disclaimer, the term of this patent is extended or adjusted under 35 U.S.C. 154(b) by 0 days.

(21) Appl. No.: 09/553,257

(22) Filed: Apr. 20, 2000

(51) Int. Cl.$^7$ ....................................... G03F 7/027
(52) U.S. Cl. .................... 430/288.1; 430/284.1; 430/910; 522/88
(58) Field of Search ............................ 522/88; 430/281.1, 430/288.1, 284.1

(56) References Cited

U.S. PATENT DOCUMENTS

| | | | |
|---|---|---|---|
| 4,287,039 | * 9/1981 | Buethe et al. | 204/159.19 |
| 5,045,435 | * 9/1991 | Adams et al. | 430/288 |
| 5,387,494 | * 2/1995 | Barr et al. | 430/281 |
| 6,140,386 | * 10/2000 | Vanderhoff et al. | 522/78 |

* cited by examiner

*Primary Examiner*—Rosemary Ashton
(74) *Attorney, Agent, or Firm*—Christensen O'Connor Johnson Kindness PLLC

(57) ABSTRACT

The present invention discloses a process for preparing a water-dispersible photosensitive composition, including the steps of: (a) adding an unsaturated photomonomer and/or a plasticizer to a carboxyl-group bearing acrylic resin solution which contains at least an organic solvent; (b) distilling and removing said organic solvent to form a resin paste; (c) dissolving a photoinitiator and an alkaline into said resin paste; (d: adding deionized water and mixing thoroughly to form an emulsion; and (e) adjusting the viscosity or said emulsion with a water-soluble resin.

20 Claims, No Drawings

PROCESS FOR PREPARING WATER DISPERSIBLE NEGATIVE-TYPE PHOTOSENSITIVE COMPOSITIONS

BACKGROUND OF THE INVENTION

1. Field of the Invention

The present invention relates to a process for preparing water dispersible negative-type photosensitive compositions. Particularly, the water dispersible negative-type photosensitive compositions prepared by the process of the present invention have low solvent content and are useful as resists for forming printed circuits, printing plates or solder masks.

2. Description of the Related Arts

Photosensitive material used in the process of manufacturing printed circuit board may be classified into 3 categories: photoresist for etching, dielectric for build-up processes and solder resist. The photoresist for etching is used in the etching of copper-conductor circuits and should be stripped from the surface of copper-conductor circuits after etching. The dielectric for build-up processes is used for the insulation of layers of copper-conductor circuits. The solder resist is applied onto partial circuits after the manufacturing of copper-conductor circuits has been finished. In addition, the photosensitive material can be classified liquid type or dry film type according to their outward appearance. The liquid type photosensitive material is usually coated onto circuit boards by screen printing, roller coating, curtain coating or dip coating. Dry film type photosensitive material is first applied onto a transparent polyester substrate, then the photosensitive layer is heated and laminated to the circuit board substrate.

Further, photosensitive material can also be classified as solvent-developable or alkaline aqueous-developable according to the pattern of development. The former uses organic solvent as developing solution, which is a potential irritant and harmful to staff during operation. Further, contamination arising from evaporation increases the recovery costs. Thus, solvent-developable photosensitive material is gradually being replaced by alkaline aqueous-developable material. The developing solution used in the alkaline aqueous-developable material is mostly sodium carbonate aqueous solution. Because the binder is present in the photosensitive composition contains carboxyl groups, it can be neutralized by sodium carbonate to form salts during development. This causes the photosensitive composition which has not been exposed to be emulsified and dispersed in the water. Thus, the purpose of the development is achieved.

The components of the photosensitive composition include binder, photomonomer, photoinitiator, thermal inhibitor, storage stabilizer, plasticizer and other additives. Because the components are not completely compatible each other, the addition of 30–70% of organic solvents to dissolve and disperse each component is necessary. See, e.g. U.S. Pat. Nos. 4,418,138, 4,537,855, 4,604,343, 5,364,737, 5,393,643, 5,387,494, 5,389,495 and 5,411,837. The type of organic solvents depends on the purpose of the photosensitive composition, including dichloromethane, chloroform, tetrachloromethane, ethyl alcohol, n-propyl alcohol, isopropyl alcohol, n-butyl alcohol, 2-butyl alcohol, isobutyl alcohol, n-pentyl alcohol, 2-methyl-1-butanol, isopentyl alcohol, n-hexyl alcohol, propyleneglycol monomethyl ether, dipropyleneglycol monomethyl ether, carbitol, acetone, methyl ethyl ketone and propyleneglycol monomethyl ether acetate, etc.

The bulk use of organic solvents is potentially risky for the operators and increases the recovery costs, thus decreasing the competitiveness of this material. The photosensitive compositions prepared by the methods of the prior art contain at least 20%–30% of organic solvents (See, e.g. Barr, U.S. Pat. No. 5,389,495 and Bttomley et al, U.S. Pat. No. 5,411,837). Thus, the present invention aims to replace organic solvents with water while maintaining the desired properties of a photosensitive composition for making electric circuit substrates.

SUMMARY OF THE INVENTION

It is therefore a primary object of the present invention to provide a process for preparing a water-dispersible photosensitive composition, comprising the steps of: (a) adding an unsaturated photomonomer and/or a plasticizer to a carboxyl-group bearing acrylic resin solution which contains at least an organic solvent; (b) distilling and removing said organic solvent to form a resin paste; (c dissolving a photoinitiator and an alkaline into said resin paste; (d) adding deionized water and mixing thoroughly to form an emulsion; and (e) adjusting the viscosity of said emulsion with a water-soluble resin.

The novelty of the present invention is the first step, in which a photomonomer and/or a plasticizer is dissolved in an acrylic resin solution containing an organic solvent (this acrylic resin bears carboxyl groups). The organic solvent in the mixture mentioned above is then removed in a distillation manner arid circulated for reuse. Therefore, the solvent content of the produced photosensitive composition can be reduced to a relatively low level, and the solvent used can be circulated for reuse so that the production costs (e.g. the treatments of waste liquid and waste air) can be decreased.

The present invention will be more fully understood and further advantages will become apparent when reference is made to the following description of the invention.

DETAILED DESCRIPTION OF THE INVENTION

The present invention provides a process for preparing a water-dispersible photosensitive composition, comprising the steps of: (a) adding an unsaturated photomonomer and/or a plasticizer to a carboxyl-group bearing acrylic resin solution which contains at least an organic solvent; (b) distilling and removing said organic solvent to form a resin paste; (c) dissolving a photoinitiator and an alkaline into said resin paste; (d) adding deionized water and mixing thoroughly to form an emulsion; and (e) adjusting the viscosity of said emulsion with a water-soluble resin.

In the process of the present invention, the binder (acrylic resin) in step (a) is synthesized from the solution polymerization of an acrylic monomer in the presence of an organic solvent. Suitable acrylic monomer is selected from the group consisting of acrylic acid, methacrylic acid, maleic acid, fumaric acid, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, hexyl acrylate, hexyl methacrylate, acrylamide, cyanoacrylate and styrene. The introduction of carboxyl-group bearing acrylic acid or methacrylic acid can cause the photosensitive composition to meet the requirements of alkaline aqueous development and increase the hydrophilicity. Optionally, the introduction of another acrylic monomer can easily adjust the hydrophilicity and the glass transition temperature ($T_g$) of the acrylic resin. The greater hydrophilicity of the acrylic resin, the more compatible with all the components in the photosensitive composition with water and the greater the developing effect. However, the adhesion of the photosensitive composition will be lower. The $T_g$ will affect the viscosity of the photosensitive composition after heating. The lower $T_g$ makes the photosensitive layers wet and sticky, and thus not appropriate for the operation of image transfer.

Generally, acrylic resin may be synthesized by way of solution polymerization in the presence of organic solvent. Suitable solvent includes dichloromethane, chloroform, tetrachloromethane, acetone, methyl ethyl ketone, ethyl alcohol, n-propyl alcohol, isopropyl alcohol, n-butyl alcohol, diethyl ketone, propyleneglycol monomethyl ether and propyleneglycol monomethyl ether acetate. The reaction temperature is based on the thermal polymerization initiator. If the reaction temperature is higher than the boiling point of the solvent, then the polymerization has to be performed under pressure, otherwise solvent evaporation will occur during the reaction. The common polymerization temperature ranges from 70° C. to 130° C. Two or more solvents described above may be used according to the solubility of acrylic resin. The resulting polymerized acrylic resin has an acid value ranging from 70 to 190 mg-KOH/kg, and a molecular weight (MW) ranging from 5,000 to 50,000.

In accordance with the process of the present invention, the solvent has to be removed by the distillation method prior to adding other components to the photosensitive composition. The $T_g$ of the acrylic resin used is very high, ranging from 95° C. to 135° C. Therefore, the introduction of photomonomer or plasticizer with multi-functional groups prior to removing the solvent can avoid excess viscosity. Due to the presence of small molecules such as photomonomers or plasticizers with multi-functional groups, the solvent can be removed rapidly and completely from the acrylic resin. To facilitate the evaporation of the solvent, the distillation may be carried out under reduced pressure. Because the solvent distillated is not contaminated by the environment, it can be circulated for reuse in solution polymerization.

According to the present invention, the photoinitiator is not limited. However, for a liquid type photosensitive composition, a photoinitiator with great decomposition capacity is preferred, thereby preventing oxygen inhibition from reducing the level of cross linkage. Suitable photoinitiators includes benzyl dimethyl ketal, 2,4-diethylthioxanthone, isopropylthioxanthone, 2-methyl-1-(4-(methylthio)phenyl)-2-morpholinopropanone-1 and Michler's ketone.

According to the present invention, a photomonomer for which the number of unsaturated groups is equal to or greater than 5 may be used. This provides double bonds for polymerization in the photosensitive composition under UV exposure. The more unsaturated double bonds contained in one molecule, the higher level of cross linkage obtained. A suitable amount of photomonomer is 10–50 parts by weight based on 100 parts by weight of the acrylic resin. If the amount is less than 10 parts by weight, it is not sufficient to provide cross linkage and thus reduce the adhesive ability. If the amount is higher than 50 parts by weight, it will make the photosensitive layers too sticky and thus contaminate the exposure films, thus preventing the operation of image transfer. Suitable photomonomers for which the number of unsaturated groups is equal to or greater than 5 include dipentaerythritol pentaacrylate, dipentaerythritol hexaacrylate and aromatic urethane hexaacrylate, and preferably dipentaerythritol hexaacrylate. One or more of the photomonomers described above may be used at the same time. The type and amount of the photomonomer depends on the thermal hardness of the coating.

In addition, a photomonomer for which the number of unsaturated groups is less than 5 may also be used in the present invention. This can elevate the photosensitivity and facilitate the polymerization of the photosensitive composition under UV exposure. A suitable amount of photomonomer which has less than 5 unsaturated groups is 0–30 parts by weight based on 100 parts by weight of the acrylic resin. If the amount is higher than 40 parts by weight, it will make the photosensitive layers wet and sticky, and thus difficult to dry. Suitable photomonomers which the number of unsaturated groups is less than 5 include trimethylolpropane triacrylate, trimethylolpropane trimethacrylate, SR454 (Sartomer Co.), PM4155, PM4158, PM4149 (Henkel Co.), pentaerythritol triacrylate, pentaerythritol trimethacrylate, pentaerythritol tetraacrylate and pentaerythritol tetramethacrylate. One or more of the photomonomers described above may be used at the same time. The type and amount of the photomonomer depends on the thermal hardness of the coating.

According to the present invention, the plasticizer has the properties of low molecular weight and high boiling point. By diffusing unto and expanding the microstructure of the resin, the photosensitive composition is softened and the reaction of hardening is facilitated. Suitable plasticizers include phosphate such as tricresyl phosphate, triphenyl phosphate, tributyl phosphate, tris(2-ethylhexyl)phosphate; polyethylene glycol, polypropylene glycol, triethylene glycol, triethylene glycol diacetate, triethylene glycol dipropionate, triethylene glycol diacrylate, tetraethylene glycol, tetraethylene glycol diacetate, tetraethylene glycol diheptanoate, diethyl adipate; and phthalate such as dioctyl phthalate, diundecyl phthalate, dicyclohexyl phthalate, diphenyl phthalate, butyl benzyl phthalate. One or more of the plasticizers described above may be used at the same time. The type and amount of the plasticizer depends on the thermal hardness of the coating.

In accordance with the process of the present invention, the total amount of the unsaturated photomonomer and/or plasticizer is 20–70 parts by weight based on 100 parts by weight of the acrylic resin.

The alkaline used in the present invention can neutralize he carboxyl groups of the acrylic resin to form a salt and further be emulsified with water, thereby dispersing and dissolving the photosensitive composition. The alkaline has to possess the ability to emulsify acrylic resin, and the amount of alkaline used has to neutralize more than 30% of carboxyl groups in the acrylic resin. If less than 30% of the carboxyl groups are neutralized, the acrylic resin will not completely emulsify, and thus the photosensitive composition can not be dispersed and dissolved n water. Suitable alkalines can be selected from hydroxides such as sodium hydroxide, potassium hydroxide; carbonates such as sodium carbonate, sodium bicarbonate, potassium carbonate, potassium bicarbonate; oxalates such as sodium oxalate, sodium acid oxalate, potassium oxalate, potassium acid oxalate; phenoxide ion; ammonium hydroxide aqueous solution; or varieties of amines, e.g. primary amine such as methyl amine, ethyl amine, propyl amine, butyl amine; secondary amine such as dimethyl amine; tertiary amine such as trimethyl amine; alkoxy amine such as ethoxy amine, dimethyl ethoxy amine, diethoxy amine, triethoxy amine, 2-amino-2-methyl-propan-1,3-diol; aromatic amine such as aniline; and asymmetric ring containing nitrogen atoms such as morpholine. In terms of being environmental friendly, inorganic alkaline is preferred, including ammonium hydroxide, sodium hydroxide, potassium hydroxide, sodium carbonate, sodium phenoxide and potassium phenoxide.

According to the present invention, the water-soluble resin can stabilize the photosensitive composition and adjust the viscosity. Preferably, the amount of water-soluble resin is 0.2–5 parts by weight based on 100 parts by weight of the acrylic resin. Both excess and insufficient amounts will hinder the operation of coating. Suitable water-soluble resin includes cellulose resin such as methyl cellulose, hydroxyethyl cellulose, hydroxypropyl cellulose, carboxymethyl cellulose and carboxymethyl cellulose sodium salts; gelatin; polyethylene glycol; and polyacrylamide and acrylamide copolymers. The cellulose resin or polyacrylamide and acrylamide copolymers are preferred. If polyethylene glycol or polyacrylamide is used, the choice of one with high molecular weight is desirable.

In addition to components described above, minor amounts (generally less than 10 parts by weight based on 100 parts by weight of the acrylic resin) of conventional additives may be used, including antifoam agents, flatteners, dyes, slipping agents, adhesion promoters, thixotropic agents, sensitizers, fillers and other surface tension modifiers.

The water dispersible negative-type photosensitive compositions prepared according to the process of the present invention may be coated by any of the coating systems known in the art, such as screen printing, roller coating, curtain coating and dip coating.

The water dispersible negative-type photosensitive compositions prepared according to the process of the present invention have low solvent content, and are useful as resists for forming printed circuits, printing plates or solder masks. By the process of coating, drying, exposing and developing, the photosensitive composition can be patterned on the substrate of a printed circuit board.

The purpose of the present invention is to improve the defects of solvent-borne photosensitive composition. Thus, by adjusting the sequence the components of the photosensitive composition are added, the organic solvent can be circulated for reuse during the production process. Further, the present invention uses water in lieu of up to 90% of the organic solvent without impacting the properties needed for printed circuit boards. The advantages include: (1) water is harmless to human; (2) water cannot burn and will not induce industrial disaster; (3) water is inexpensive; (4) water is easily available and cannot be monopolized; (5) water will not evaporate into toxic air; (6) water is easily circulated and reused; and (7) the photosensitive composition of the present invention can be developed with water or alkaline aqueous solution, which follows the trend of the market.

Without intending to limit it in any manner, the present invention will be further illustrated by the following examples.

EXAMPLE

Preparation Example

Synthesis of Resin Paste (I)

241.6 g of propyheneglycol monomethyl ether was added to a reaction bottle with 4 openings, then heated to 90° C. and filled with nitrogen gas. A clear solution containing 216.0 g of acrylic acid, 901.5 g of methyl methacrylate, 966.6 g of propyleneglycol monomethyl ether and 65.1 g of N,N'-azobisisobutyronitrile (ABIN) was added drop by drop to the reaction bottle over the period of 200 minutes, the reaction continuing for 4 hours to give a resin solution with 50% of solid content and $T_g$ 106° C. Weight average molecular weight of 15,000 was measured by gel permeation chromatography (GPC) using a polystyrene standard. 362.5 g of SR399, dipentaerythritol pentaacrylate (Sartomer Co.) and 120.8 g of tricresyl phosphate were added sequentially to the resin solution. The organic solvent was separated by distilling under reduced pressure to give resin paste (I)

Synthesis of Resin Paste (II)

135.2 g of diethyl ketone was added to a reaction bottle with 4 openings, then heated to 90° C. and filled with nitrogen gas. A clear solution containing 155.5 g of acrylic acid, 943.6 g of methyl methacrylate, 59.6 g of butyl methacrylate, 540.8 g of propyleneglycol monomethyl ether acetate and 28.2 g of N,N'-azobisisobutyronitrile was added drop by drop to the reaction bottle over the period of 200 minutes, the reaction continuing for 4 hours to give a resin solution with 60% of solid content and $T_g$ 101° C. Weight average molecular weight of 21,000 was measured by gel permeation chromatography (GPC) using a polystyrene standard. 478.0 g of SR399 (Sartomer Co.) was added to the resin solution, then the organic solvent was separated by distilling under reduced pressure to give resin paste (II).

Synthesis of Resin Paste (III)

123.0 g of propyleneglycol monomethyl ether was added to a reaction bottle with 4 openings, then heated to 90° C. and filled with nitrogen gas. A clear solution containing 206.6 g of methacrylic acid, 937.4 g of styrene, 85.2 g of butyl methacrylate, 41.9 g of propyleneglycol monomethyl ether and 14.5 g of N,N'-azobisisobutyronitrile was added drop by drop to the reaction bottle over the period of 200 minutes, the reaction continuing for 4 hours to give a resin solution with 65% of solid content and $T_g$ 112° C. Weight average molecular weight of 30,000 was measured by gel permeation chromatography (GPC) using a polystyrene standard. 374.3 g of SR399 (Sartomer Co.), 124.8 g of PM4149 (Henkel Co.) and 249.5 g of tricresyl phosphate were added sequentially co the resin solution, then the organic solvent was separated by distilling under reduced pressure to give resin paste (III).

Synthesis of Resin Paste (IV)

187.0 g of diethyl ketone was added to a reaction bottle with 4 openings, then heated to 90° C. and filled with nitrogen gas. A clear solution containing 289.3 g of methacrylic acid, 899.9 g of styrene, 747.9 g of propyleneglycol monomethyl ether acetate and 10.1 g of N,N'-azobisisobutyronitrile was added drop by drop to the reaction bottle over the period of 200 minutes, the reaction continuing for 4 hours to give a resin solution with 55% of solid content and $T_g$ 126° C. Weight average molecular weight of 45,000 was measured by gel permeation chromatography (GPC) using a polystyrene standard. 240.5 g of SR399 (Sartomer Co.), 120.3 g of PM4149 (Henkel Co.) and 60.1 g of tetraethylene glycol diacetate were added sequentially to the resin solution, then the organic solvent was separated by distilling under reduced pressure to give resin paste (IV).

Example 1

Preparing the following photosensitive components:

| | |
|---|---|
| Resin paste (I) | 140.0 g |
| 2-Methyl-1(4-(methylthio)phenyl)-2-morpholinopropanone-1 | 7.0 g |

-continued

| Preparing the following photosensitive components: | |
|---|---|
| 2-Dimethylaminoethyl benzoate | 0.3 g |
| Hydroxyethyl cellulose | 4.0 g |
| Micronized SiO$_2$ | 10.0 g |
| Aerosil-200 (Degussa Co.) | 3.0 g |
| Modaflow 2100 | 1.0 g |
| Defoamer DC-1000 (Deuchem Trading Co.) | 2.0 g |
| Blue 603 | 1.5 g |
| Hydroquinone | 0.5 g |
| NaOH$_{(aq)}$ 10 wt % | 95.0 g |
| Deionized water | 130.0 g |

The components listed above were stirred and mixed well. After grinding in the tripple-roll mill, the photosensitive composition was printed onto the copper foil substrate by using screen printing method, then the substrate was placed in the oven, dried at 80° C. for 10 minutes. After cooling, the substrate was covered with the film and exposed with the energy of 80 mJ/cm$^2$ in the UV exposing machine, then developed with 1.0% Na$_2$CO$_{3(aq)}$. The copper foil desired to be etched was exposed and etched in the CuCl$_{2(aq)}$, and then the photoresist was removed with 1% NaOH$_{(aq)}$. The test result is shown in Table 1.

Example 2

| Preparing the following photosensitive components: | |
|---|---|
| Resin paste (II) | 140.0 g |
| Benzyl dimethyl ketal | 7.0 g |
| carboxymethyl cellulose | 2.0 g |
| Aerosil-200 (Degussa Co.) | 2.0 g |
| Modaflow 2100 | 1.0 g |
| Defoamer DC-1000 (Deuchem Trading Co.) | 2.0 g |
| Malachite green | 1.0 g |
| Hydroquinone | 0.5 g |
| Na$_2$CO$_{3(aq)}$ 10 wt % | 190.0 g |
| Deionized water | 160.0 g |

The components listed above were stirred and mixed well. After grinding in the tripple-roll mill, the photosensitive composition was printed onto the copper foil substrate by using screen printing method, then the substrate was placed in the oven, dried at 80° C. for 10 minutes. After cooling, the substrate was covered with the film and exposed with the energy of 80 mJ/cm$^2$ in the UV exposing machine, then developed with 1.0% Na$_2$CO$_{3(aq)}$. The copper foil desired to be etched was exposed and etched in the CuCl$_{2(aq)}$, and then the photoresist was removed with 1% NaOH$_{(aq)}$. The test result is shown in Table 1.

Example 3

| Preparing the following photosensitive components: | |
|---|---|
| Resin paste (III) | 160.0 g |
| Benzyl dimethyl ketal | 10.0 g |
| Polyacrylamide (carboxyl modified) | 3.0 g |
| Aerosil-200 (Degussa Co.) | 2.0 g |
| Modaflow 2100 | 1.0 g |
| Defoamer DC-1000 (Deuchem Trading Co.) | 2.0 g |
| Malachite green | 1.0 g |
| Hydroquinone | 0.5 g |

-continued

| Preparing the following photosensitive components: | |
|---|---|
| Na$_2$CO$_{3(aq)}$ 10 wt % | 201.0 g |
| Deionized water | 170.0 g |

The components Listed above were stirred and mixed well. After grinding in the tripple-roll mill, the photosensitive composition was printed onto the copper foil substrate by using screen printing method, then the substrate was placed in the oven, dried at 80° C. for 10 minutes. After cooling, the substrate was covered with the film and exposed with the energy of 80 mJ/cm$^2$ in the UV exposing machine, then developed with 1.0% Na$_2$CO$_{3(aq)}$. The copper foil desired to be etched was exposed and etched in the CuCl$_2$ $_{(aq)}$, and then the photoresist was removed with 1% NaOH $_{(aq)}$. The test result is shown in Table 1.

Example 4

| Preparing the following photosensitive components: | |
|---|---|
| Resin paste (IV) | 140.0 g |
| Irgacure 369 (Ciba Co.) | 6.0 g |
| 2-Dimethylaminoethyl benzoate | 0.4 g |
| Methyl cellulose | 1.5 g |
| Aerosil-200 (Degussa Co.) | 2.0 g |
| Modaflow 2100 | 1.0 g |
| Defoamer DC-1000 (Deuchem Trading Co.) | 2.0 g |
| Malachite green | 1.0 g |
| Hydroquinone | 0.5 g |
| Potassium phenoxide, 10 wt % | 205.0 g |
| Deionized water | 100.0 g |

The components Listed above were stirred and mixed well. After grinding in the tripple-roll mill, the photosensitive composition was printed onto the copper foil substrate by using screen printing method, then the substrate was placed in the oven, dried a 80° C. for 10 minutes. After cooling, the substrate was covered with the film and exposed with the energy of 80 mJ/cm$^2$ in the UV exposing machine, then developed with 1.0% Na$_2$CO$_{3(aq)}$. The copper foil desired to be etched was exposed and etched in the CuCl$_2$ $_{(aq)}$, and then the photoresist was removed with 1% NaOH $_{(aq)}$. The test result is shown in Table 1.

TABLE 1

Properties of liquid-type photoresist

| Example | 1 | 2 | 3 | 4 | Comparative Example[a] |
|---|---|---|---|---|---|
| Thermal hardness (before exposure) | ◉ | ◉ | ○ | ◉ | X[b] |
| Resolution ($\mu$m) | 50 | 50 | 50 | 50 | 60 |
| Adhesion (100 grids, crosscut) | 100 | 100 | 100 | 100 | 100 |
| Exposure dosage (80 mJ/cm$^2$) | 6 | 6 | 5 | 6 | 6 |
| Pencil hardness (after exposure) | 1H | 2H | 1H | 1H | <HB |

TABLE 1-continued

Properties of liquid-type photoresist

| Example | 1 | 2 | 3 | 4 | Comparative Example[a] |
|---|---|---|---|---|---|
| Etching resistance | OK | OK | OK | OK | OK |
| Time for film removal (sec) | 28 | 31 | 35 | 25 | 45 |

[a]The comparative example was a dry film type photoresist (local company, Cat. No. 5715), which was tested after tearing the PET film off.
[b]Symbols represented ◉ > ○ > X; wherein X represented the exposure film was contaminated.

The data shown in Table 1 demonstrates that the photosensitive composition prepared by the present invention not only possesses the same resolution, adhesion and etching resistance as dry film type photoresist, but also has the advantages such as not sticking to film before exposure, high hardness after exposure and short time for film removal. In addition, the process according to the present invention uses water as solvent, and organic solvent is removed by distilling during the production process, revealing the low level of organic solvent residing in the photosensitive composition, and thus is suitable for the operation of image transfer. It is clear that the photosensitive composition prepared by the process of the present invention meets the requirements needed for printed circuit boards in any manner, and reduces the use of large quantities of organic solvent.

While the invention has been particularly shown and described with the reference to the preferred embodiment thereof, it be understood by those skilled in the art that various changes in form and details may be made without departing from the spirit and scope of the invention.

What is claimed is:

1. A process for preparing a water-dispersible photosensitive composition, comprising the steps of:
   (a) adding an unsaturated photomonomer and/or a plasticizer to a carboxyl-group bearing acrylic resin solution which contains at least an organic solvent;
   (b) distilling and removing said organic solvent to form a resin paste;
   (c) dissolving a photoinitiator and an alkaline into said resin paste;
   (d) adding deionized water and mixing thoroughly to form an emulsion; and
   (e) adjusting the viscosity of said emulsion with a water-soluble resin.

2. The process as claimed in claim 1, wherein said carboxyl-group bearing acrylic resin is synthesized from the solution polymerization of a monomer selected from the group consisting of acrylic acid, methacrylic acid, alkyl methacrylate and styrene in the presence of said organic solvent.

3. The process as claimed in claim 2, wherein said carboxyl-group bearing acrylic resin has an acid value ranging from 70 to 190 mg-KOH/kg.

4. The process as claimed in claim 3, wherein said carboxyl-group bearing acrylic resin has a glass transition temperature ($T_g$) ranging from 95° C. to 135° C.

5. The process as claimed in claim 4, wherein said carboxyl-group bearing acrylic resin has a molecular weight (MW) ranging From 5,000 to 50,000.

6. The process as claimed in claim 1 or 2, wherein said organic solvent is selected from the group consisting of dichloromethane, chloroform, tetrachloromethane, acetone, methyl ethyl ketone, ethyl alcohol, n-propyl alcohol, isopropyl alcohol, n-butyl alcohol, diethyl ketone, propyleneglycol monomethyl ether and propyleneglycol monomethyl ether acetate.

7. The process as claimed in claim 1, wherein the total amount of said unsaturated photomonomer and/or a plasticizer is 20–70 parts by weight based on 100 parts by weight of said carboxyl-group bearing acrylic resin.

8. The process as claimed in claim 7, wherein the number of unsaturated groups in said unsaturated photomonomer is equal to or greater than 5.

9. The process as claimed in claim 8, wherein said unsaturated photomonomer is selected from the group consisting of dipentaerythritol pentaacrylate, dipentaerythritol hexaacrylate, aromatic urethane hexaacrylate and the combination thereof.

10. The process as claimed in claim 9, wherein said unsaturated photomonomer is dipentaerythritol hexaacrylate.

11. The process as claimed in claim 1, wherein step (a) further comprises an additional unsaturated photomonomer for which the number of unsaturated groups is less than 5.

12. The process as claimed in claim 11, wherein the amount of said unsaturated photomonomer with less than 5 unsaturated groups is 0–30 parts by weight based on 100 parts by weight of said carboxyl-group bearing acrylic resin.

13. The process as claimed in claim 1, wherein said plasticizer is selected from the group consisting of tricresyl phosphate, triphenyl phosphate, tributyl phosphate, tris(2-ethylhexyl)phosphate, polyethylene glycol, polypropylene glycol, triethylene glycol, triethylene glycol diacetate, triethylene glycol dipropionate, triethylene glycol diacrylate, tetraethylene glycol, tetraethylene glycol diacetate, tetraethylene glycol diheptanoate, diethyl adipate, dioctyl phthalate, diundecyl phthalate, dicyclohexyl phthalate, diphenyl phthalate and butyl benzyl phthalate.

14. The process as claimed in claim 13, wherein said plasticizer is tricresyl phosphate or tetraethylene glycol diacetate.

15. The process as claimed in claim 1, wherein said alkaline neutralize more than 30% of carboxyl group in said carboxyl-group bearing acrylic resin.

16. The process as claimed in claim 15, wherein said alkaline is selected from the group consisting of ammonium hydroxide, sodium hydroxide, potassium hydroxide, sodium carbonate, sodium phenoxide and potassium phenoxide.

17. The process as claimed in claim 1, wherein the amount of said water-soluble resin is 0.2–5 parts by weight based on 100 parts by weight of said carboxyl-group bearing acrylic resin.

18. The process as claimed in claim 17, wherein said water-soluble resin is cellulose resin.

19. The process as claimed in claim 18, wherein said water-soluble resin is selected from the group consisting of methyl cellulose, hydroxyethyl cellulose, hydroxypropyl cellulose, carboxymethyl cellulose and carboxymethyl cellulose sodium salt.

20. The process as claimed in claim 17, wherein said water-soluble resin is a copolymer of polyacrylamide and acrylamide.

* * * * *